US012666896B2

(12) United States Patent
Liu et al.

(10) Patent No.: US 12,666,896 B2
(45) Date of Patent: Jun. 23, 2026

(54) VENT PORT DIFFUSER

(71) Applicant: Taiwan Semiconductor Manufacturing Company Ltd., Hsinchu (TW)

(72) Inventors: Yung-Tsun Liu, Taipei City (TW); Chao-Hung Wan, Taichung City (TW); Kuang-Wei Cheng, Hsinchu City (TW); Chih-Tsung Lee, Hsinchu City (TW); Chyi-Tsong Ni, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1047 days.

(21) Appl. No.: 17/446,396

(22) Filed: Aug. 30, 2021

(65) Prior Publication Data

US 2023/0062038 A1 Mar. 2, 2023

(51) Int. Cl.
H10P 72/00 (2026.01)
B08B 5/00 (2006.01)

(52) U.S. Cl.
CPC ............ H10P 72/0402 (2026.01); B08B 5/00 (2013.01)

(58) Field of Classification Search
CPC ......... H01L 21/67017; H01L 21/67196; H01L 31/024; B08B 5/00; B08B 5/04; B08B 5/02; F24F 7/04; F24F 7/08; H10P 72/0402; H10P 72/0464
USPC .............................................. 137/43, 599.01
See application file for complete search history.

(56) References Cited

U.S. PATENT DOCUMENTS

| | | | | | |
|---|---|---|---|---|---|
| 2,427,780 | A | * | 9/1947 | Haines ...................... | F24F 7/04 |
| | | | | | 454/339 |
| 4,159,673 | A | * | 7/1979 | Weirich .................... | F24F 7/04 |
| | | | | | 454/260 |
| 2003/0221779 | A1 | * | 12/2003 | Okuda ...................... | B08B 5/00 |
| | | | | | 118/712 |
| 2009/0114156 | A1 | * | 5/2009 | Nodera ................. | C23C 16/345 |
| | | | | | 118/725 |

(Continued)

FOREIGN PATENT DOCUMENTS

KR 20150115443 A * 10/2015 ....... H01L 21/67109

OTHER PUBLICATIONS

Machine translation of KR-20150115443-A (Year: 2015).*

*Primary Examiner* — Craig M Schneider
*Assistant Examiner* — Andrew J Rost
(74) *Attorney, Agent, or Firm* — Harrity & Harrity, LLP

(57) ABSTRACT

A chamber of a semiconductor fabrication facility may include a vent port diffuser. The vent port diffuser may include a first tube member configured to couple the vent port diffuser to a vent port of the chamber. The vent port diffuser may include a second tube member coupled to the first tube member. The second tube member may comprise a plurality of openings spaced along a length of the second tube member, with the plurality of openings configured to receive a fluid from the chamber. Based on the semiconductor fabrication facility including the vent port diffuser, the chamber may be configured to provide an improved flow field of a fluid within the chamber. In this way, the vent port diffuser may reduce defects of semiconductor devices transported through the chamber that might otherwise be caused by contaminants.

19 Claims, 10 Drawing Sheets

(56)　　　　　　References Cited

U.S. PATENT DOCUMENTS

2020/0135522 A1　　4/2020　Reuter et al.
2021/0259087 A1 *　8/2021　Ramachandran ...........................
　　　　　　　　　　　　　　　　　　H01L 21/67201

* cited by examiner

510  Receive a fluid from a chamber via a plurality of openings spaced along a length of a first tube member of a vent port diffuser 520  Provide the fluid from the first tube member to a second tube member of the vent port diffuser 530  Provide the fluid to the vent port via the second tube member

500

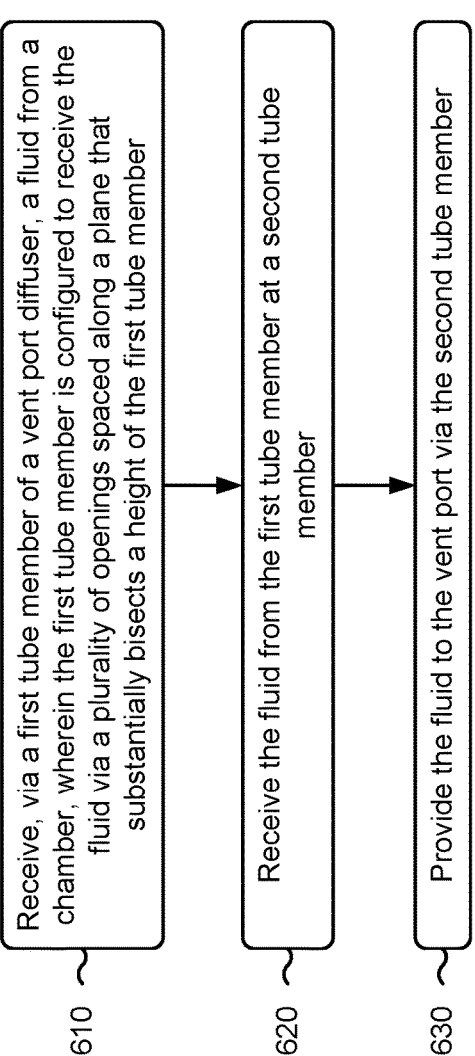

600

610 Receive, via a first tube member of a vent port diffuser, a fluid from a chamber, wherein the first tube member is configured to receive the fluid via a plurality of openings spaced along a plane that substantially bisects a height of the first tube member 620 Receive the fluid from the first tube member at a second tube member 630 Provide the fluid to the vent port via the second tube member

FIG. 6

VENT PORT DIFFUSER

BACKGROUND

A semiconductor device may be processed in various semiconductor processing tools in a semiconductor fabrication facility to produce various integrated circuits and/or semiconductor devices. A semiconductor device may be transported throughout the semiconductor fabrication facility and/or between a chamber and the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 and 6 are flowcharts of example processes associated with a vent port diffuser.

DETAILED DESCRIPTION

Figure 1:
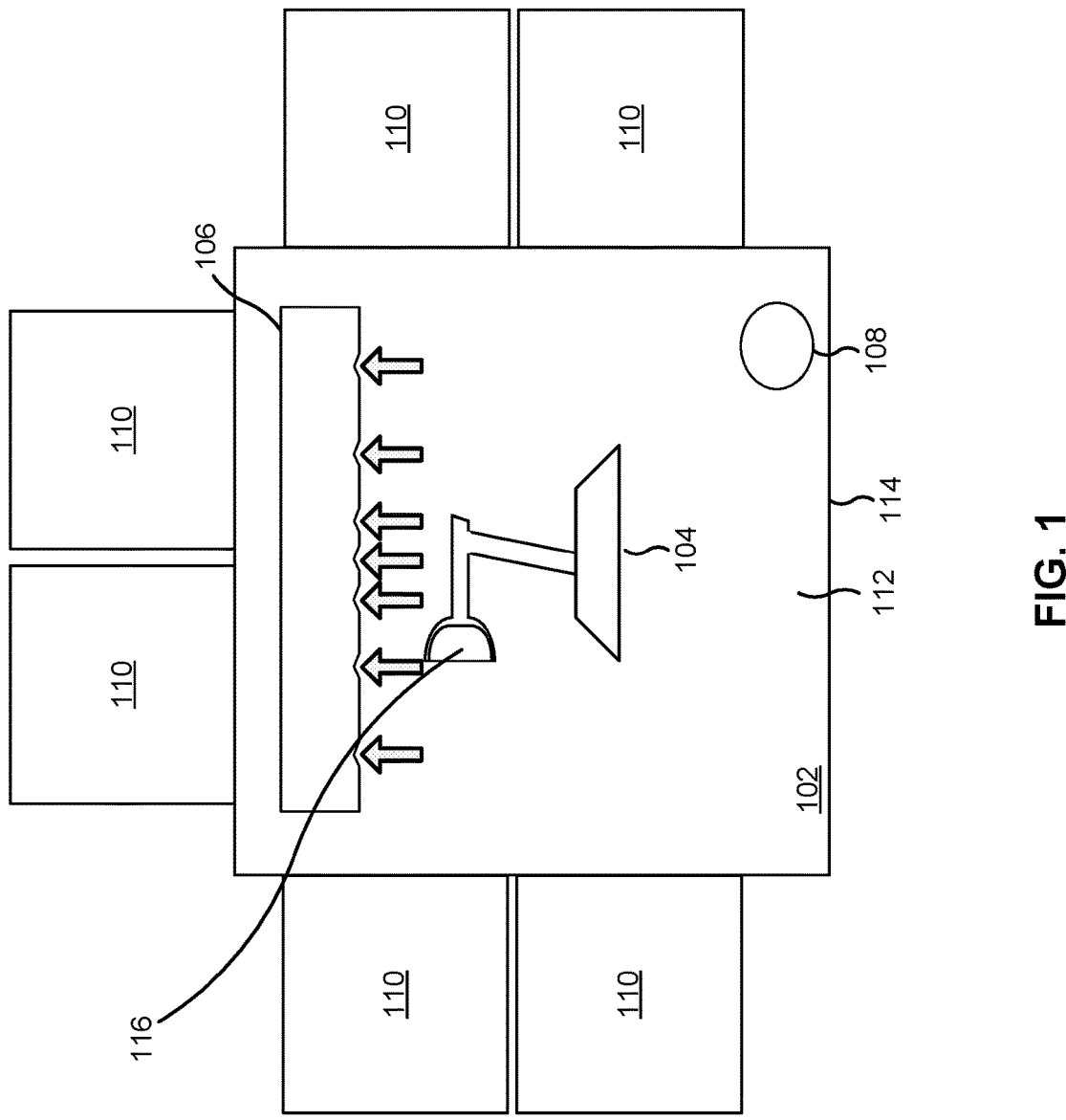
FIG. 1 is a diagram of an example of a semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor fabrication facility may include one or more semiconductor processing tools to process a semiconductor device. For example, the semiconductor fabrication facility may use the one or more semiconductor processing tools to form the semiconductor device on a wafer and/or die. The semiconductor fabrication facility may include a chamber through which a transport tool may transport the semiconductor device to and/or from the one or more semiconductor processing tools. The semiconductor device may be exposed to contaminants (e.g., volatile organic compounds (VOCs), dust, debris, and other types of contaminants) in the chamber during transfer of the semiconductor device within the chamber. These contaminants may cause semiconductor device failures, may cause defects to occur in an integrated circuit and/or the semiconductor device formed in the semiconductor fabrication facility, and may reduce manufacturing yield and quality, among other examples. Moreover, the impact of the contaminants in the semiconductor fabrication facility may continue to become more significant due to decreased tolerance to the contaminants as device and/or feature sizes of the integrated circuits and/or the semiconductor devices, that are to be formed on semiconductor wafers in the semiconductor fabrication facility, continue to shrink.

To reduce exposure to contaminants, the chamber may include a pump port that provides a fluid material (e.g., a gas, such as nitrogen gas) to the chamber. The chamber may further include a vent port that vents the fluid material from the chamber. Together, the pump port and the vent port may circulate the fluid within the chamber to displace contaminants from the transport tool and/or the semiconductor device. However, a flow field within the chamber may be non-uniform based in the vent port and the pump port being asymmetric within the chamber, the transport tool obstructing airflow, among other examples. The non-uniform flow field may reduce an effectiveness of the fluid to displace contaminants from the semiconductor device while in the chamber.

Some implementations described herein provide a vent port diffuser that may be coupled to a vent port of a chamber. In some implementations, the vent port diffuser may include multiple openings to receive a fluid from the chamber (e.g., indirectly from the pump port) to improve uniformity of a flow field of the fluid within the chamber. In some implementations, the vent port diffuser may include a first tube member configured to be coupled to the vent port at a first end and to a second tube member at a second end. The first tube member may extend from a surface of the chamber (e.g., from the surface that includes the vent port) to separate the second tube member from the surface of the chamber. For example, the first tube member may elevate the second tube member from a lower surface of the chamber. In some implementations, the second tube member may be generally parallel with a lower surface of the chamber.

In some implementations, the second tube member may include a plurality of openings spaced along a length of the second tube member. The plurality of openings may be oriented generally toward a farthest sidewall of the chamber. In some implementations, the plurality of openings may be oriented generally toward a side wall that is closest to a pump port. In some implementations, the plurality of openings may be positioned at generally a same height along the length of the second tube member. The plurality of openings may be polygonal-shaped or elliptical-shaped, among other examples. In some implementations, an opening, of the plurality of openings may be spaced from adjacent openings based on a distance from the opening to a plane that bisects the length of the second tube member or based on a distance from the opening to a longitudinal axis of the first tube member (e.g., where the first tube member couples to the second tube member). For example, spacing between adjacent openings may be larger for openings that are farther from the plane that bisects the length of the second tube member or the longitudinal axis of the first tube member.

Based on a semiconductor fabrication facility including the vent port diffuser within the chamber, the chamber may be configured to provide an improved flow field of a fluid within the chamber. In this way, the vent port diffuser may reduce defects of semiconductor devices transported through the chamber that might otherwise be caused by contaminants, may increase manufacturing yield and quality in the semiconductor fabrication facility, and/or may permit continued reduction in device and/or feature sizes of integrated circuits and/or semiconductor devices that are to be formed on semiconductor wafers processed in the semiconductor fabrication facility.

FIG. 1 is a diagram of an example semiconductor processing environment 100 described herein. The example semiconductor processing environment 100 may include, or may be included in, a semiconductor fabrication facility, a semiconductor foundry, a semiconductor processing facility, a semiconductor clean room, and/or another environment in which semiconductor devices and/or devices are processed. As shown in FIG. 1, the example semiconductor processing environment 100 may include a chamber 102, a transport tool 104, a vent port diffuser 106, a pump port 108, and one or more semiconductor processing tools 110, among other tools and/or devices.

The chamber 102 may include, or may be included in, a mainframe chamber, a transfer chamber, or a clean room, among other examples of devices through which semiconductor devices may be transported during, or between, manufacturing operations. The chamber 102 may include a lower surface 112, one or more side surfaces 114 (e.g., sidewalls), and/or an upper surface (not shown). The pump port 108 may be configured to provide a fluid into the chamber 102 via a surface of the chamber 102, such as the lower surface 112, a side surface 114, or the upper surface. The pump port 108 may be positioned in a location that is uncentered between opposite side walls 114. The pump port 108 may be positioned near one or more side walls 114 and/or may be positioned near a corner of the chamber 102.

The chamber may also include a vent port configured to receive a fluid and to vent the fluid from the chamber 102 via a surface of the chamber 102, such as the lower surface 112, a side surface 114, or the upper surface. In some implementations, the vent port may be configured to vent the fluid with a flow rate of greater than or equal to 550 centimeters/second. In some implementations, the fluid includes a gas configured to displace contaminants from a region above the transport tool 104 in the interior of the chamber 102. The vent port may be coupled to the vent port diffuser 106.

In some implementations, the chamber 102 may provide a partially or fully enclosed space for transportation of a semiconductor devices. The chamber 102 may include, and/or house, the transport tool 104. The transport tool 104 (e.g., a wafer/die transport tool) may include a mobile robot, a robot arm, a tram or rail car, an overhead hoist transfer (OHT) vehicle, an automated material handling system (AMHS), and/or another type of tool that is used to transport devices and/or dies between the one or more semiconductor processing tools 110 and/or to and from other locations such as a wafer rack, a storage room, and/or the like. The transport tool 104 may include one or more surfaces 116 of the transport tool 104 that are configured to support one or more semiconductor devices (e.g., a wafer and/or a die) within the chamber 102. In some implementations, transport tool 104 may be programmed to travel a particular path and/or may operate semi-autonomously or autonomously.

The one or more semiconductor processing tools 110 may include one or more tools configured to perform one or more semiconductor processing operations on one or more semiconductor wafers and/or devices. For example, the one or more semiconductor processing tools 110 may include a deposition tool (e.g., a semiconductor processing tool configured to deposit one or more layers onto a semiconductor device), a plating tool (e.g., an electroplating tool configured to deposit one or more metal layers onto a semiconductor device), an exposure tool (e.g., an extreme ultraviolet (EUV) tool, an electron beam (e-beam) tool), an etch tool (e.g., a wet etch tool, a dry etch tool), or another type of semiconductor processing tool.

In some implementations, one or more particles associated with a process performed by the one or more semiconductor processing tools 110 may travel from the one or more semiconductor processing tools 110 to the chamber 102. The one or more particles may contaminate a semiconductor device in the chamber 102 if the one or more particles fall on a surface of the semiconductor device.

To reduce a fall on particle out of control (OOC) rate (e.g., to approximately 7% or less) within the chamber 102, the pump port 108 and/or the vent port diffuser 106 may be configured to provide a flow field with an improved flow field relative to a chamber without a vent port diffuser 106. As shown in FIG. 1, the vent port diffuser 106 may receive a fluid from the chamber (e.g., a fluid that is provided via the pump vent) in a way that may disperse low-pressure areas caused by the vent port. To disperse the low-pressure areas, the vent port diffuser 106 may include a plurality of openings spaced along a length of a tube member (e.g., a second tube member) of the vent port diffuser 106. The second tube member of the vent port diffuser 106 may extend along a side surface 114 of the chamber 102. In some implementations, the tube member of the vent port diffuser 106 may be substantially parallel to the lower surface 112 of the chamber 102 and/or to the upper surface of the chamber 102. Additionally, or alternatively, the tube member of the vent port diffuser 106 may be substantially parallel to a side surface 114 of the chamber 102.

In some implementations, the plurality of openings may be configured within the tube member to provide an improved uniform flow field. In some implementations, to provide an improved uniform flow field, the plurality of openings may be arranged with spacing (e.g., along the length of the tube member) to disperse low-pressure areas to each of the plurality of openings (e.g., with substantially equal pressures at the plurality of openings). For example, a spacing from an opening, of the plurality of openings, to adjacent openings may be based on a distance from the opening to a plane that bisects the length of the tube member and/or a longitudinal axis of an additional tube member (e.g., a first tube member, not shown) of the vent port diffuser 106 that couples the tube member to a vent port. In some implementations, spacing between openings may increase as openings are farther from a center of the tube member or farther from a connection to the vent port.

In some implementations, the plurality of openings may be configured with opening shapes to provide an improved uniform flow field. For example, the plurality of openings may be polygonal-shaped (e.g., hexagonal-shaped rectangular-shaped, square-shaped, or triangular-shaped, among other examples) or curved (e.g., ellipse-shaped, circular-shaped, or oval-shaped, among other examples), among other examples.

In some implementations, the plurality of openings may be configured with different sizes to provide an improved uniform flow field. For example, a size of an opening, of the plurality of openings, may be based on a distance from the opening to the plane that bisects the length of the tube member and/or the longitudinal axis of the additional tube member (e.g., the first tube member, not shown) of the vent port diffuser 106 that couples the tube member to the vent port. In some implementations, sizes of openings may decrease as openings are farther from a center of the tube member or farther from a connection to the vent port.

Based on the chamber 102 including the vent port diffuser 106, the chamber 102 may be configured to provide an improved flow field of a fluid within the chamber 102. In this way, the vent port diffuser 106 may reduce defects of semiconductor devices transported through the chamber 102 that might otherwise be caused by contaminants, may increase manufacturing yield and quality in a semiconductor fabrication facility that includes the chamber 102, and/or may permit continued reduction in device and/or feature sizes of integrated circuits and/or semiconductor devices that are to be formed on semiconductor wafers processed in the semiconductor fabrication facility.

As indicated above, FIG. 1 is provided as an example. Other examples may differ from what is described with regard to FIG. 1.

Figures 2A, 2B, 2C:
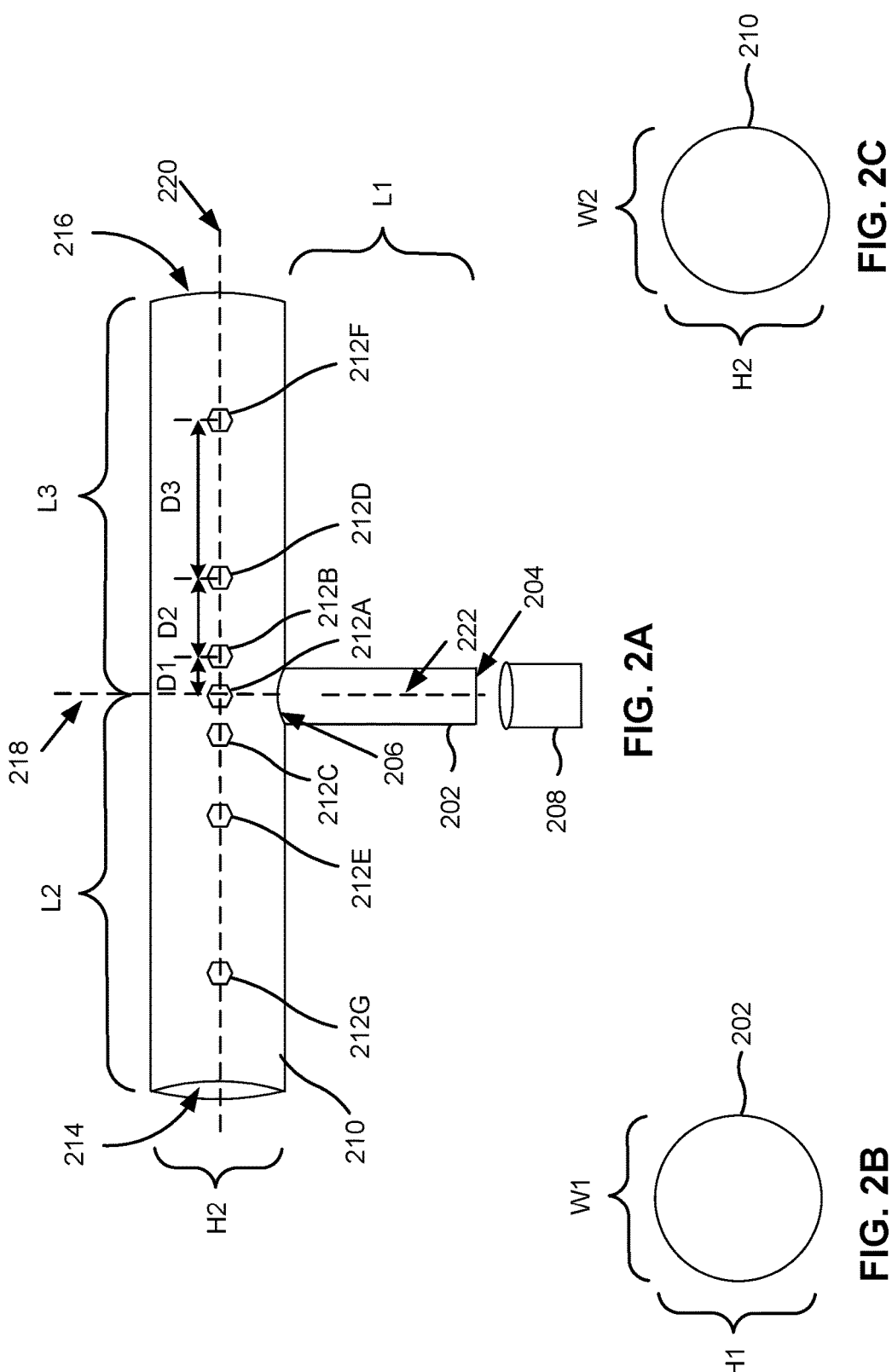
FIGS. 2A-2C are diagrams of an example vent port diffuser described herein.

FIGS. 2A-2C are diagrams of an example vent port diffuser 106 described herein. The vent port diffuser 106 may include a tube member 202 having a first end 204 and a second end 206. The tube member 202 may have a height H1, a width W1 (e.g., shown in FIG. 2B), and a length L1. In some implementations, the tube member 202 may be column-shaped (e.g., H1=W1). The tube member 202 may be configured to couple the vent port diffuser 106 to a vent port 208 at the first end 204. In some implementations, the vent port 208 may be positioned within a surface of a chamber 102. For example, the vent port 208 may be positioned within a lower surface 112, a side surface 114, or an upper surface of the chamber 102. The tube member 202 may be configured to vent a fluid from the vent port diffuser 106 into the vent port 208.

In some implementations, the tube member 202 may be coupled to a tube member 210 of the vent port diffuser 106 at the second end 206. The tube member 210 may be substantially perpendicular to the tube member 202. The tube member 210 may have a height H2, a width W2 (e.g., shown in FIG. 2C), and a length (L2+L3). In some implementations, the tube member 202 may be column-shaped (e.g., H1=W1). In some implementations, the tube member 210 may be generally parallel with a lower surface 112 of the chamber 102.

The tube member 210 may include a plurality of openings 212 spaced along a length (L2+L3) of the tube member 210. In some implementations, the plurality of openings 212 may be positioned to be substantially parallel to a longitudinal axis of the tube member 210. The plurality of openings 212 may be configured to receive the fluid from the chamber 102 into the tube member 210. The plurality of openings 212 may include openings 212A, 212B, 212C, 212D, 212E, 212F and/or 212G spaced along a length of the tube member 210. In some implementations, the plurality of openings 212 may have cross-section areas that are substantially equal. In some implementations, cross-section areas of the plurality of openings 212 may be smaller than a cross-section area of the first end 204 of the tube member 202 that is configured to couple the vent port diffuser 106 to the vent port 208.

In some implementations, the tube member 210 may include a first opening 214 and a second opening 216 at longitudinal ends of the tube member 210. The first opening 214 and the second opening 216 may be larger than the plurality of openings 212. For example, the first opening 214 and the second opening 216 may have larger cross-sections than cross-section areas of the plurality of openings 212. In some implementations, the first opening 214 and/or the second opening 216 may be elliptical-shaped openings. In other words, the tube member 210 may have an elliptical-shaped cross-section that is substantially orthogonal to a length of the tube member 210.

For reference, FIG. 2A illustrates a plane 218 that bisects a length of the tube member 210 (e.g., bisects the length into L2 and L3), a plane 220 that substantially bisects a height H2 of the tube member 210, and a longitudinal axis 222 of the tube member 202. In some implementations, the longitudinal axis 222 may be substantially within the plane 218. In other words, the tube member 210 may be centered on the longitudinal axis of the tube member 202. The tube member 210 may be coupled to the tube member 202 substantially at the plane 218.

In some implementations, the plurality of openings 212 may be arranged with symmetry about the plane 218 and/or the longitudinal axis 222. For example, opening 212B may be symmetric with opening 212C, opening 212D may be symmetric with opening 212E, and opening 212F may be symmetric with opening 212G about the plane 218 and/or the longitudinal axis 222. In some implementations, the plurality of openings 212 may be positioned within the tube member 210 along the plane 220.

As shown in FIG. 2A, the opening 212B may be spaced a lateral distance D1 from the plane 218 and/or the longitudinal axis 222 (e.g., measured from a center of opening 212B along the plane 220). The opening 212B may be spaced a lateral distance D2 from the opening 212D. The opening 212D may be spaced a lateral distance D3 from the opening 212F. In some implementations, D1 is less than D2 and/or D2 is less than D3. In other words, spacing between an opening (e.g., opening 212B) and an adjacent opening (e.g., opening 212D), of the plurality of openings 212, may be based on a lateral distance (e.g., D1) of the opening (e.g., opening 212B) from the longitudinal axis 222 of the tube member 202 and/or from the plane 218 that bisects the length of the tube member 210.

In some implementations, L2 and L3 may be between approximately 9.5 centimeters (cm) to approximately 10.5 cm (e.g., based on a size of the chamber 102). A height of the vent port diffuser 106 (e.g., L1+H2) may be between approximately 7.2 cm to 8.9 cm. The height H2 and/or the width W2 of the tube member 210 may be between approximately 2.8 cm and 3.4 cm. The width W1 and/or the length L1 of the tube member 202 may be between approximately 1 centimeter and 1.4 cm. In some implementations, the plurality of openings 212 may have cross-section areas between approximately 0.5 cm and 1.2 cm.

Based on the vent port diffuser 106 including the plurality of openings 212 within the tube member 210, the vent port diffuser 106 may be configured to provide an improved flow field of a fluid within the chamber 102. In this way, the vent port diffuser 106 may reduce defects of semiconductor devices transported through the chamber 102 that might otherwise be caused by contaminants, may increase manufacturing yield and quality in a semiconductor fabrication facility that includes the chamber 102, and/or may permit continued reduction in device and/or feature sizes of integrated circuits and/or semiconductor devices that are to be formed on semiconductor wafers processed in the semiconductor fabrication facility.

As indicated above, FIGS. 2A-2C are provided as an example. Other examples may differ from what is described with regard to FIGS. 2A-2C.

Figure 3A:
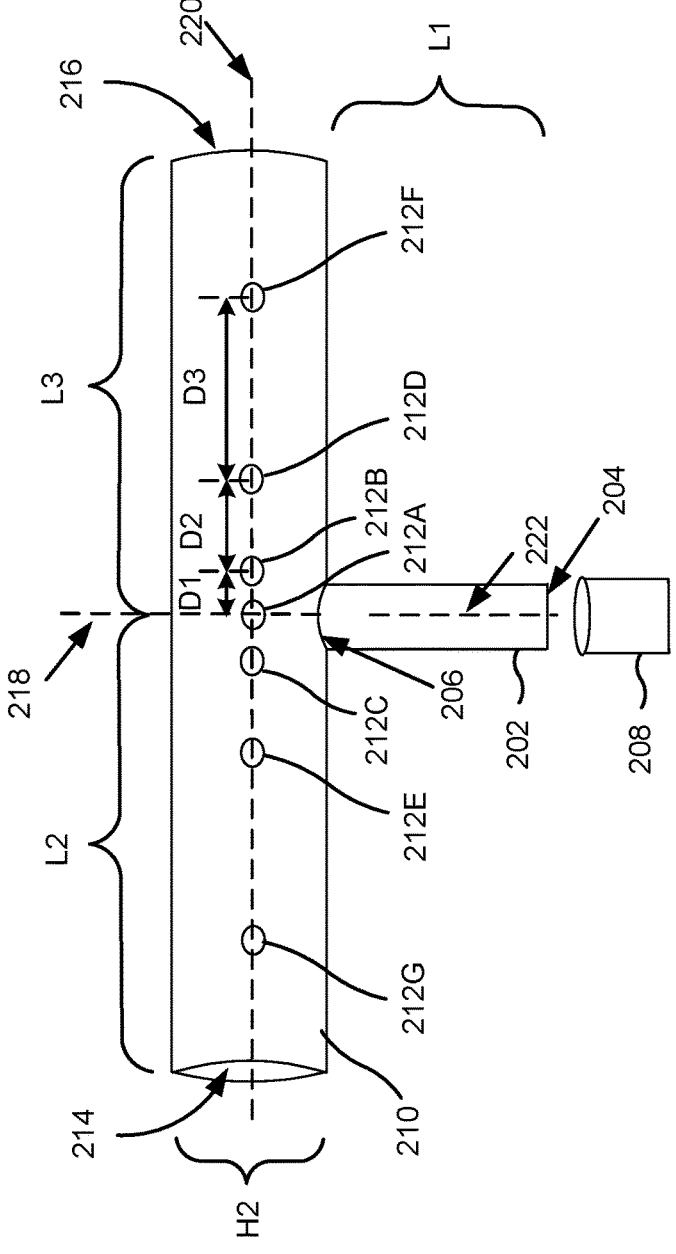
FIGS. 3A-3E are diagrams of additional example vent port diffusers described herein.
Figure 3B:
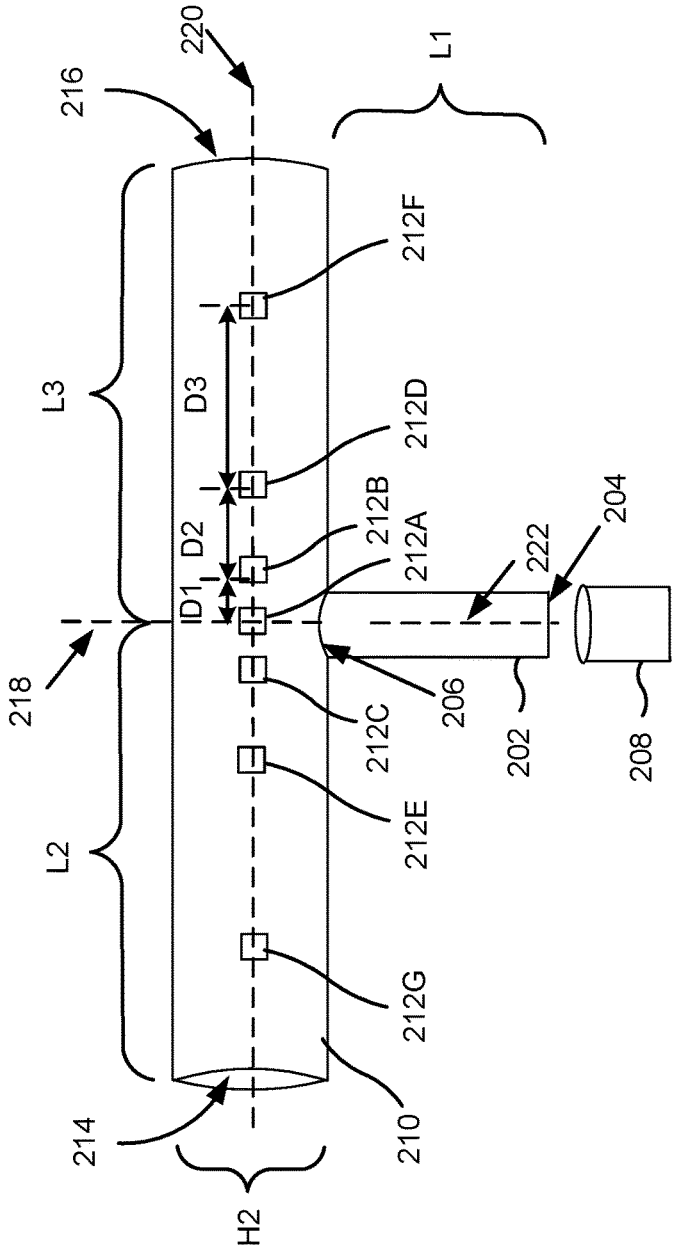
Figure 3C:
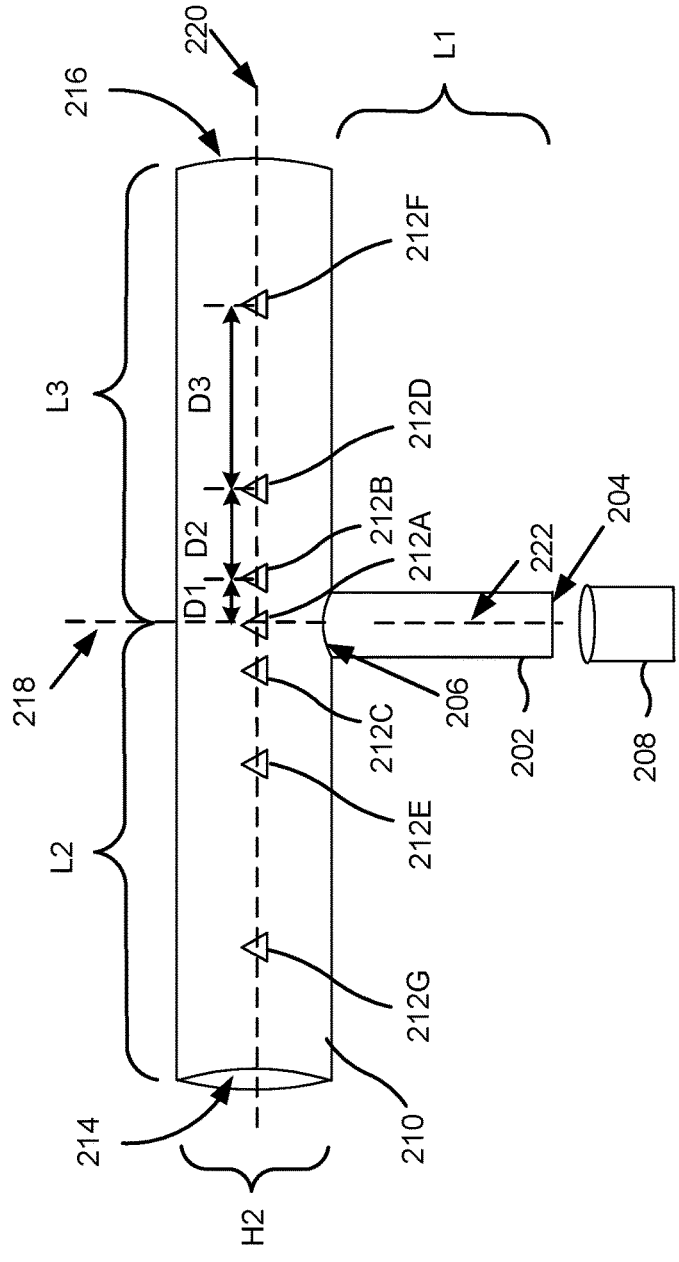

FIGS. 3A-3E are diagrams of additional example vent port diffusers described herein. As shown by FIG. 3A, the plurality of openings 212 may be curved (e.g., elliptical-shaped) openings. As shown by FIG. 3B, the plurality of openings 212 may be rectangular-shaped. As shown by FIG. 3B, the plurality of openings 212 may be triangular-shaped. Other examples may include openings with shapes that differ from what is described with regard to FIGS. 3A-3C.

Figure 3D:
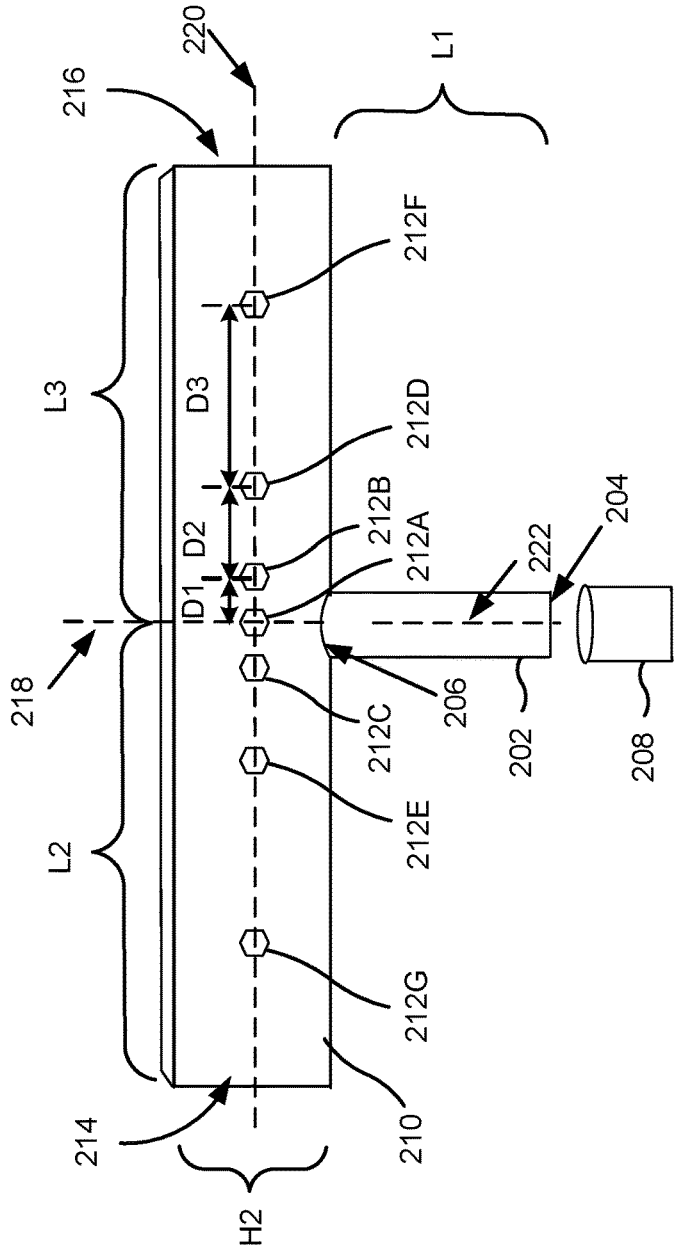

As shown by FIG. 3D, the tube member 210 may have a polygonal-shaped first opening 214 and/or second opening 216. In other words, the tube member 210 may include planar surfaces, including, for example, a planar surface on which the plurality of openings 212 are positioned.

Figure 3E:
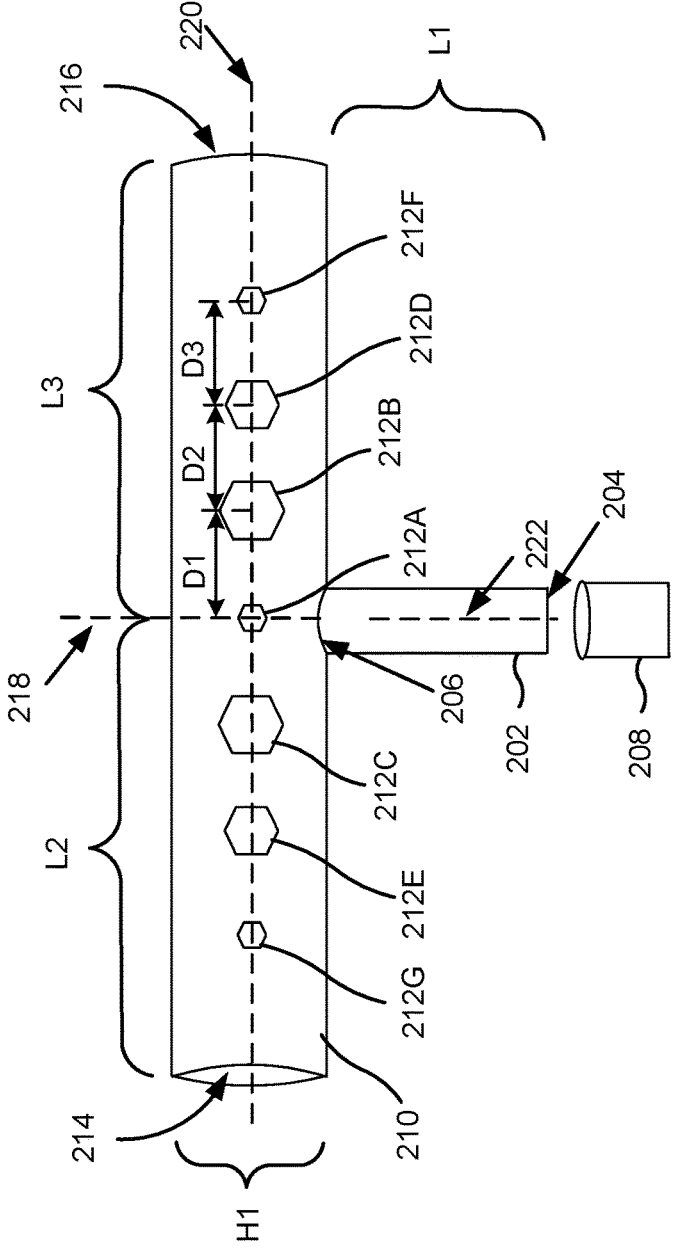

As shown by FIG. 3E, the plurality of openings 212 may have non-uniform sizing. As shown, opening 212B may be larger than opening 212D and/or opening 212D may be larger than opening 212F. In some implementations, sizes of the plurality of openings 212 may be based on distances of the plurality of openings from the plane 218 and/or the longitudinal axis 222 of the tube member 202. In some implementations, sizes may decrease as openings are farther from a center of the tube member 202 or farther from a connection to the vent port 208 (e.g., via the second end 206 of the tube member 202). In some implementations, config-uring the plurality of openings 212 with sizes that decrease based on distances of the plurality of openings from the plane 218 and/or the longitudinal axis 222 of the tube member 202 may have a similar effect as configuring the plurality of openings 212 with spacing between adjacent openings based on distances of the plurality of openings from the plane 218 and/or the longitudinal axis 222 of the tube member 202.

As indicated above, FIGS. 3A-3E are provided as examples of the vent port diffuser. Other examples may differ from what is described with regard to FIGS. 2A-2C. For example, an opening, of the plurality of openings, may include a set of openings (e.g., an array of openings). For example, an opening may include multiple openings at a same distance from the plane that bisects the length of the second tube member or the longitudinal axis of the first tube member (e.g., stacked openings). In other examples, an opening may include multiple openings centered on a defined distance from the plane that bisects the length of the second tube member or the longitudinal axis of the first tube member (e.g., grouped openings).

Figure 4:
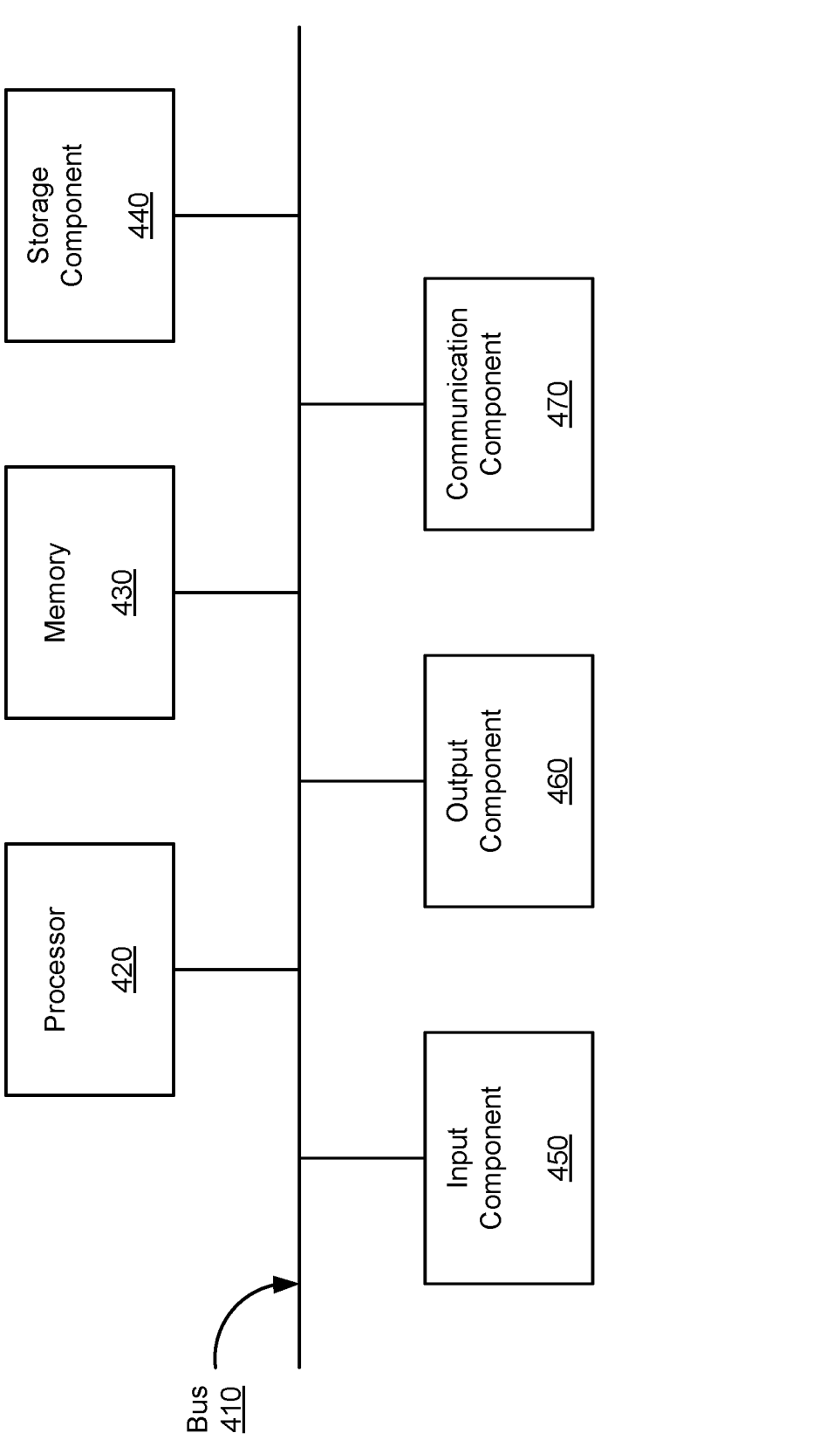
FIG. 4 is a diagram of example components of a device associated with one or more devices described herein.

FIG. 4 is a diagram of example components of a device 400, which may correspond to a device and/or a controller associated with the chamber 102, the transport tool 104, and/or the vent port diffuser 106. In some implementations, the device and/or the controller may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-program-mable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or soft-ware related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input compo-nent 450 may include a touch screen, a keyboard, a keypad, a mouse, a button, a microphone, a switch, a sensor, a global positioning system component, an accelerometer, a gyro-scope, and/or an actuator. Output component 460 enables device 400 to provide output, such as via a display, a speaker, and/or one or more light-emitting diodes. Commu-nication component 470 enables device 400 to communicate with other devices, such as via a wired connection and/or a wireless connection. For example, communication compo-nent 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instruc-tions to perform one or more processes described herein. In some implementations, execution of the set of instructions, by one or more processors 420, causes the one or more processors 420 and/or the device 400 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different com-ponents, or differently arranged components than those shown in FIG. 4. Additionally, or alternatively, a set of components (e.g., one or more components) of device 400 may perform one or more functions described as being performed by another set of components of device 400.

Figure 5:
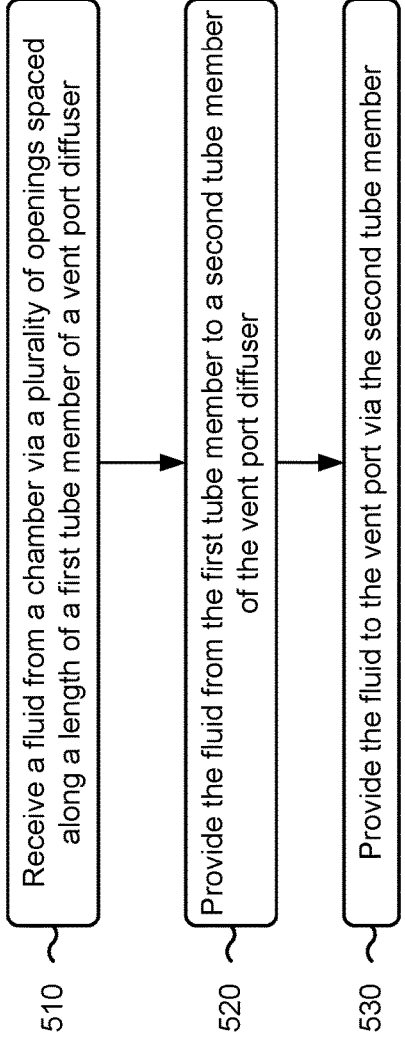

FIG. 5 is a flowchart of an example process 500 associ-ated with vent port diffuser. In some implementations, one or more process blocks of FIG. 5 may be performed by a vent port diffuser (e.g., vent port diffuser 106). In some imple-mentations, one or more process blocks of FIG. 5 may be performed by another device or a group of devices separate from or including the vent port diffuser, such as the chamber 102, the transport tool 104, the vent port diffuser 106, and/or a device and/or a controller associated with the chamber 102, the transport tool 104, and/or the vent port diffuser 106. Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include receiving a fluid from a chamber via a plurality of openings spaced along a length of a first tube member of a vent port diffuser (block 510). For example, the vent port diffuser 106 may receive a fluid from a chamber 102 via a plurality of openings 212 spaced along a length of a first tube member 210 of the vent port diffuser 106, as described above. In some implementations, the first tube member 210 is coupled to a second tube member 202 of the vent port diffuser 106.

As further shown in FIG. 5, process 500 may include providing the fluid from the first tube member to the second tube member of the vent port diffuser (block 520). For example, the vent port diffuser 106 may provide the fluid from the first tube member 210 to the second tube member 202, as described above. In some implementations, the second tube member 202 is coupled to a vent port 208 of the chamber 102 at a first end 204 of the second tube member 202. In some implementations, the second tube member 202 is coupled to the first tube member 210 at a second end 206 of the second tube member 202.

As further shown in FIG. 5, process 500 may include providing the fluid to the vent port via the second tube member (block 530). For example, the vent port diffuser 106 may provide the fluid to the vent port 208 via the second tube member 202, as described above.

Process 500 may include additional implementations, such as any single implementation or any combination of implementations described below and/or in connection with one or more other processes described elsewhere herein.

In a first implementation, the first tube member is coupled to the second tube member at a plane that bisects a length of the first tube member.

In a second implementation, alone or in combination with the first implementation, the plurality of openings are positioned within the first tube member along a plane that substantially bisects a height of the first tube member.

In a third implementation, alone or in combination with one or more of the first and second implementations, a first opening, of the plurality of openings, is positioned at a first lateral distance from a longitudinal axis of the second tube member, wherein a second opening, of the plurality of openings, is positioned at a second lateral distance from the first opening, and wherein the second lateral distance is greater than the first lateral distance.

In a fourth implementation, alone or in combination with one or more of the first through third implementations, the first tube member has an elliptical-shaped cross-section that is substantially orthogonal to a length of the first tube member.

In a fifth implementation, alone or in combination with one or more of the first through fourth implementations, the plurality of openings are arranged with symmetry about a longitudinal axis of the second tube member.

In a sixth implementation, alone or in combination with one or more of the first through fifth implementations, the first tube member comprises a first opening at a first end and a second opening at a second end, and wherein the first opening has a first cross-section area and the second opening has a second cross-section area, wherein the first cross-section area and the second cross-section area are larger than cross-section areas of the plurality of openings.

In a seventh implementation, alone or in combination with one or more of the first through sixth implementations, cross-section areas of the plurality of openings are substantially equal.

In an eighth implementation, alone or in combination with one or more of the first through seventh implementations, cross-section areas of the plurality of openings are smaller than a cross-section area of the first end of the second tube member.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with vent port diffuser. In some implementations, one or more process blocks of FIG. 6 may be performed by a vent port diffuser (e.g., vent port diffuser 106). In some implementations, one or more process blocks of FIG. 6 may be performed by another device or a group of devices separate from or including the vent port diffuser, such as the chamber 102, the transport tool 104, the vent port diffuser 106, and/or a device and/or a controller associated with the chamber 102, the transport tool 104, and/or the vent port diffuser 106. Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include receiving, via a first tube member of a vent port diffuser, a fluid from a chamber, wherein the first tube member is configured to receive the fluid via a plurality of openings spaced along a plane that substantially bisects a height of the first tube member (block 610). For example, the vent port diffuser 106 may receive, via a first tube member 210 of the vent port diffuser 106, a fluid from a chamber 102, as described above. In some implementations, the first tube member 210 is configured to receive the fluid via a plurality of openings 212 spaced along a plane 220 that substantially bisects a height H2 of the first tube member 210. In some implementations, the plurality of openings 212 are substantially symmetric about a longitudinal axis 222 of the first tube member 210. In some implementations, spacing between an opening 212 and an adjacent opening 212, of the plurality of openings 212, is based on a lateral distance of the opening 212 from the longitudinal axis 222 of a second tube member 202 of the vent port diffuser 106.

As further shown in FIG. 6, process 600 may include receiving the fluid from the first tube member at the second tube member (block 620). For example, the vent port diffuser 106 may receive the fluid from the first tube member 210 at the second tube member 202, as described above. In some implementations, the second tube member 202 is coupled, at a first end 204 of the second tube member 202, to a vent port 208 of the chamber 102. In some implementations, the second tube member 202 is coupled, at a second end 206 of the second tube member 202, to the first tube member 210.

As further shown in FIG. 6, process 600 may include providing the fluid to the vent port via the second tube member (block 630). For example, the vent port diffuser 106 may provide the fluid to the vent port 208 via the second tube member 202, as described above.

Process 600 may include additional implementations, such as any single implementation or any combination of implementations described below and/or in connection with one or more other processes described elsewhere herein.

In a first implementation, the first tube member is substantially parallel to a lower surface of the chamber.

In a second implementation, alone or in combination with the first implementation, the first tube member is substantially perpendicular to the second tube member.

In a third implementation, alone or in combination with one or more of the first and second implementations, the plurality of openings comprise polygonal-shaped openings.

In a fourth implementation, alone or in combination with one or more of the first through third implementations, the polygonal-shaped openings comprise hexagonal-shaped openings.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Based on a chamber including a vent port diffuser 106 (e.g., as described with regard to FIGS. 2A-3E), the chamber may be configured to provide an improved flow field of a fluid within the chamber. In this way, the vent port diffuser may reduce defects of semiconductor devices transported through the chamber that might otherwise be caused by contaminants, may increase manufacturing yield and quality in a semiconductor fabrication facility that includes the chamber, and/or may permit continued reduction in device and/or feature sizes of integrated circuits and/or semiconductor devices that are to be formed on semiconductor wafers processed in the semiconductor fabrication facility.

As described in greater detail above, some implementations described herein provide a method. The method includes receiving a fluid from a chamber via a plurality of openings spaced along a length of a first tube member of a vent port diffuser, where the first tube member is coupled to a second tube member of the vent port diffuser. The method also includes providing the fluid from the first tube member to the second tube member, where the second tube member is coupled to a vent port of the chamber at a first end of the second tube member, and where the second tube member is coupled to the first tube member at a second end of the second tube member. The method further includes providing the fluid to the vent port via the second tube member.

As described in greater detail above, some implementations described herein provide a method. The method includes receiving, via a first tube member of a vent port diffuser, a fluid from a chamber, where the first tube member is configured to receive the fluid via a plurality of openings spaced along a plane that substantially bisects a height of the first tube member. The plurality of openings are substantially symmetric about a longitudinal axis of the first tube member, and spacing between an opening and an adjacent opening, of the plurality of openings, is based on a lateral distance of the opening from the longitudinal axis of a second tube member of the vent port diffuser. The method also includes receiving the fluid from the first tube member at the second tube member, where the second tube member is coupled, at a first end of the second tube member, to a vent port of the chamber, and where the second tube member is coupled, at a second end of the second tube member, to the first tube member. The method further includes providing the fluid to the vent port via the second tube member.

As described in greater detail above, some implementations described herein provide a chamber. The chamber includes a transport tool in an interior of the chamber. The chamber also includes a vent port on a surface of the interior of the chamber. The chamber further includes a vent port diffuser comprising a first tube member and a second tube member. The first tube member comprises a plurality of openings spaced along a length of the first tube member, where the plurality of openings are configured to receive a fluid from the chamber. The second tube member is coupled to the vent port at a first end of the second tube member and the second tube member is coupled to the first tube member at a second end of the second tube member. The second tube member is configured to receive the fluid from the first tube member at the second end and to provide the fluid to the vent port at the first end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a fluid from a chamber via a plurality of openings spaced along a length of a first tube member of a vent port diffuser,
      wherein the first tube member is coupled to a second tube member of the vent port diffuser, and
      wherein the plurality of openings are positioned within the first tube member along a plane that substantially bisects a height of the first tube member;
   providing the fluid from the first tube member to the second tube member,
      wherein the second tube member is directly coupled to a vent port of the chamber at a first end of the second tube member, and
      wherein the second tube member is directly coupled to the first tube member at a second end of the second tube member; and
   providing the fluid to the vent port via the second tube member.

2. The method of claim 1,
   wherein the first tube member is coupled to the second tube member at a plane that bisects a length of the first tube member.

3. The method of claim 1,
   wherein a first opening, of the plurality of openings, is positioned at a first lateral distance from a longitudinal axis of the second tube member,
      wherein a second opening, of the plurality of openings, is positioned at a second lateral distance from the first opening, and
      wherein the second lateral distance is greater than the first lateral distance.

4. The method of claim 1,
   wherein the first tube member has an elliptical-shaped cross-section that is substantially orthogonal to a length of the first tube member.

5. The method of claim 1,
   wherein the plurality of openings are arranged with symmetry about a longitudinal axis of the second tube member.

6. The method of claim 1,
   wherein the first tube member comprises a first opening at a first end and a second opening at a second end,
      wherein the first opening has a first cross-section area and the second opening has a second cross-section area, and wherein the first cross-section area and the second cross-section area are larger than cross-section areas of the plurality of openings.

7. The method of claim 1,
wherein cross-section areas of the plurality of openings are substantially equal.

8. The method of claim 1,
wherein cross-section areas of the plurality of openings are smaller than a cross-section area of the first end of the second tube member.

9. A method, comprising:
receiving, via a first tube member of a vent port diffuser, a fluid from a chamber,
  wherein the first tube member is configured to receive the fluid via a plurality of openings spaced along a plane that substantially bisects a height of the first tube member,
  wherein the plurality of openings are substantially symmetric about a longitudinal axis of the first tube member, and
  wherein spacing between an opening and an adjacent opening, of the plurality of openings, is based on a lateral distance of the opening from the longitudinal axis of a second tube member of the vent port diffuser;
receiving the fluid from the first tube member at the second tube member,
  wherein the second tube member is coupled, at a first end of the second tube member, to a vent port of the chamber, and
  wherein the second tube member is coupled, at a second end of the second tube member, to the first tube member; and
providing the fluid to the vent port via the second tube member.

10. The method of claim 9,
wherein the first tube member is substantially parallel to a lower surface of the chamber.

11. The method of claim 9,
wherein the first tube member is substantially perpendicular to the second tube member.

12. The method of claim 9,
wherein the plurality of openings comprise polygonal-shaped openings.

13. The method of claim 12,
wherein the polygonal-shaped openings comprise hexagonal-shaped openings.

14. A method, comprising:
receiving, via a plurality of openings spaced along a length of a first tube member of a vent port diffuser, a fluid from a chamber;
providing the fluid from the first tube member to a second tube member of the vent port diffuser, wherein a first opening, of the plurality of openings, is positioned at a first lateral distance from a longitudinal axis of the second tube member,
  wherein a second opening, of the plurality of openings, is positioned at a second lateral distance from the first opening, and
  wherein the second lateral distance is greater than the first lateral distance; and
providing the fluid from the second tube member to a vent port on a surface of an interior of the chamber, wherein the second tube member is directly coupled to the vent port.

15. The method of claim 14,
wherein the fluid comprises a gas configured to displace contaminants from a region above a transport tool in the interior of the chamber.

16. The method of claim 14,
wherein sizes of the plurality of openings are based on distances of the plurality of openings from a longitudinal axis of the first tube member.

17. The method of claim 14,
wherein the vent port is positioned on a lower surface of the interior of the chamber,
  wherein the vent port is positioned on a side surface of the interior of the chamber, or
  wherein the vent port is positioned on an upper surface of the interior of the chamber.

18. The method of claim 14,
wherein the plurality of openings are positioned within the first tube member along a plane that substantially bisects a height of the first tube member.

19. The method of claim 14,
wherein the first tube member has an elliptical-shaped cross-section that is substantially orthogonal to a length of the first tube member.

\* \* \* \* \*